(12) United States Patent
Chung et al.

(10) Patent No.: US 8,889,560 B2
(45) Date of Patent: Nov. 18, 2014

(54) METHODS OF FORMING FINE PATTERNS FOR SEMICONDUCTOR DEVICE

(75) Inventors: Byung-hong Chung, Seoul (KR); Cha-young Yoo, Gyeonggi-do (KR); Dong-hyun Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 91 days.

(21) Appl. No.: 13/474,764

(22) Filed: May 18, 2012

(65) Prior Publication Data

US 2013/0034963 A1 Feb. 7, 2013

(30) Foreign Application Priority Data

Aug. 2, 2011 (KR) .................. 10-2011-0076992

(51) Int. Cl.
*H01L 21/311* (2006.01)
*H01L 21/3213* (2006.01)
*H01L 21/033* (2006.01)
*H01L 27/108* (2006.01)
*H01L 21/308* (2006.01)
*H01L 27/02* (2006.01)
*H01L 27/115* (2006.01)
*H01L 21/02* (2006.01)

(52) U.S. Cl.
CPC ..... *H01L 21/32139* (2013.01); *H01L 27/11568* (2013.01); *H01L 21/0338* (2013.01); *H01L 27/10888* (2013.01); *H01L 21/0217* (2013.01); *H01L 21/3088* (2013.01); *H01L 27/10891* (2013.01); *H01L 21/31116* (2013.01); *H01L 21/0228* (2013.01); *H01L 27/0207* (2013.01); *H01L 21/3086* (2013.01); *H01L 21/0337* (2013.01)
USPC ........................................ 438/702

(58) Field of Classification Search
USPC ........................................ 438/702
See application file for complete search history.

(56) References Cited

U.S. PATENT DOCUMENTS 7,786,015 B2 * 8/2010 Chen et al. ............. 438/703
7,846,756 B2 * 12/2010 Yen et al. ............... 438/42

(Continued)

FOREIGN PATENT DOCUMENTS

JP 2009094125 A 4/2009
KR 20090124353 A 12/2009
KR 1020100003062 A 1/2010

OTHER PUBLICATIONS

Lee, Hong-Ji "Reduction of Shorts between Word lines on Charge Trapping Flash Cell in a Self-Aligned Double Patterning Technology" IEEE/SEMI Adv. Semi. Manu. Conf. (ASMC) Jul. 13, 2010 pp. 84-87.*

(Continued)

*Primary Examiner* — Alexander Sofocleous
*Assistant Examiner* — Grant Withers
(74) *Attorney, Agent, or Firm* — Harness, Dickey & Pierce, P.L.C.

(57) ABSTRACT

Methods of forming fine patterns for a semiconductor device include forming a hard mask layer on an etch target layer; forming a carbon containing layer on the hard mask layer; forming carbon containing layer patterns by etching the carbon containing layer; forming spacers covering opposing side walls of each of the carbon containing layer patterns; removing the carbon containing layer patterns; forming hard mask patterns by etching the hard mask layer using the spacers as a first etching mask; and etching the etch target layer by using the hard mask patterns a second etching mask.

16 Claims, 10 Drawing Sheets

(56) References Cited

U.S. PATENT DOCUMENTS

| | | | |
|---|---|---|---|
| 7,856,613 B1* | 12/2010 | Weling et al. | 716/55 |
| 7,884,022 B2* | 2/2011 | Bai et al. | 438/702 |
| 7,972,959 B2* | 7/2011 | Mebarki et al. | 438/669 |
| 8,003,543 B2* | 8/2011 | Koh et al. | 438/717 |
| 8,030,217 B2* | 10/2011 | Niroomand et al. | 438/725 |
| 8,133,659 B2* | 3/2012 | Sun et al. | 430/311 |
| 8,415,083 B2* | 4/2013 | Sun et al. | 430/270.1 |
| 8,466,066 B2* | 6/2013 | Kim | 438/696 |
| 8,524,605 B1* | 9/2013 | Chen | 438/696 |
| 2008/0076071 A1* | 3/2008 | Lim et al. | 430/311 |
| 2008/0081461 A1* | 4/2008 | Lee et al. | 438/637 |
| 2009/0146322 A1* | 6/2009 | Weling et al. | 257/786 |
| 2009/0246706 A1* | 10/2009 | Hendel et al. | 430/314 |
| 2009/0246966 A1* | 10/2009 | Cho et al. | 438/735 |
| 2009/0263972 A1* | 10/2009 | Balseanu et al. | 438/696 |
| 2010/0105210 A1* | 4/2010 | Chen et al. | 438/702 |
| 2010/0136784 A1* | 6/2010 | Mebarki et al. | 438/669 |
| 2010/0187596 A1* | 7/2010 | Hsieh | 257/324 |
| 2011/0014786 A1* | 1/2011 | Sezginer et al. | 438/618 |
| 2011/0300711 A1* | 12/2011 | Martin et al. | 438/696 |
| 2012/0025402 A1* | 2/2012 | Bicksler | 257/786 |
| 2012/0032336 A1* | 2/2012 | Lin | 257/773 |
| 2012/0049377 A1* | 3/2012 | Yang et al. | 257/773 |
| 2012/0108079 A1* | 5/2012 | Mahajani | 438/788 |
| 2012/0137261 A1* | 5/2012 | Ban et al. | 716/52 |
| 2012/0156876 A1* | 6/2012 | Chen et al. | 438/689 |
| 2012/0289019 A1* | 11/2012 | Im et al. | 438/381 |
| 2013/0048605 A1* | 2/2013 | Sapre et al. | 216/51 |
| 2013/0065397 A1* | 3/2013 | Chen | 438/703 |
| 2013/0171825 A1* | 7/2013 | Xu | 438/694 |
| 2013/0189845 A1* | 7/2013 | Kim et al. | 438/696 |
| 2013/0244344 A1* | 9/2013 | Malmhall et al. | 438/3 |
| 2013/0244436 A1* | 9/2013 | Sandhu | 438/702 |
| 2013/0260557 A1* | 10/2013 | Wang et al. | 438/669 |
| 2013/0260562 A1* | 10/2013 | Park et al. | 438/702 |

OTHER PUBLICATIONS

Chiu, M. C. "Challenges of 29nm half-pitch NAND Flash STI patterning with 193nm dry lithography and self-aligned double patterning" Proc. SPIE 7140 Lithography Asia 2008, Dec. 4, 2008 pp. 714021-1 though 8.*

Lapeyre, C. "Cost effective SADP based on Spin on Carbon" Proc. Int. Symp. on Lithography Extensions Oct. 20-22, 2010, 2010 pp. 2-25 available online at http://www.sematech.org/meetings/archives/litho/8940/pres/DP2_01_Celine%20Lapeyre.pdf.*

* cited by examiner

METHODS OF FORMING FINE PATTERNS FOR SEMICONDUCTOR DEVICE

CROSS-REFERENCE TO RELATED APPLICATIONS

This application claims the benefit of priority from Korean Patent Application No. 10-2011-0076992, filed on Aug. 2, 2011, in the Korean Intellectual Property Office, the disclosure of which is incorporated herein by reference in its entirety.

BACKGROUND

1. Field

Example embodiments relate to methods of forming fine patterns of a semiconductor device, and/or more particularly, to methods of forming fine patterns by a double-patterning process.

2. Description of the Related Art

As the integrity of semiconductor devices increases, design rules of components in the semiconductor device are reduced. When fabricating a semiconductor device having fine patterns configured for corresponding to tendency (or, inclination or leaning) of high-integrated semiconductor devices, it is necessary to realize fine patterns exceeding the resolution limitations of a photolithography process. In addition, a technology that may form patterns having fine widths while reducing processing times for forming a mask layer is necessary.

SUMMARY

Example embodiments relate to methods of forming fine patterns of a semiconductor device, and/or more particularly, to methods of forming fine patterns by a double-patterning process.

In an example embodiment, there are provided methods of forming fine patterns of a semiconductor device, the methods capable of simplifying processes and reducing defects by reducing the number of mask layers.

In another example embodiment, there are provided methods of forming fine patterns of a semiconductor device, the methods capable of maintaining uniform line widths of patterns even when island patterns are formed.

According to an example embodiment, there is provided a method of forming fine patterns for a semiconductor device, the method including forming a hard mask layer over an etch target layer; forming a carbon containing layer over the hard mask layer; forming carbon containing layer patterns by etching the carbon containing layer; forming spacers that over opposing side walls of each of the carbon containing layer patterns; removing the carbon containing layer patterns; forming hard mask patterns by etching the hard mask layer using the spacers as a first etching mask; and etching the etch target layer by using the hard mask patterns as a second etching mask.

The forming a carbon containing layer may include forming an organic compound layer on the hard mask layer; performing a first baking process for about 90 to about 180 seconds at a temperature of about 400° C. or less; and performing a second baking process for about 2 to about 4 hours at a temperature of 700° C. or less.

The hard mask layer may be at least one oxide layer selected from a thermal oxide layer, a chemical vapor deposition (CVD) oxide layer, an undoped silicate glass (USG) film, and a high density plasma (HDP) oxide film.

The spacers may be formed of a silicon nitride material.

The forming spacers may include forming a spacer mask layer covering exposed surfaces of the carbon containing layer patterns and exposed surface of the hard mask layer; and partially removing the spacer mask layer so that upper surfaces of the carbon containing layer patterns and an upper surface of the hard mask layer are exposed, and the spacers remain on both side walls of the carbon containing layer patterns.

The forming of the spacer mask layer may include using an atomic layer deposition method.

The carbon containing layer patterns, the spacers, and the hard mask patterns may be formed as lines.

The method may further include partially trimming the hard mask patterns so as to form island patterns, after forming the hard mask patterns.

The partially trimming the hard mask patterns may include forming an etching mask layer on the hard mask patterns formed as lines; exposing at least a part of the hard mask patterns by removing portions of the etching mask layer; and etching the exposed part of the hard mask patterns.

The method may further include forming an anti-reflection layer on the carbon containing layer after forming the carbon containing layer.

During the forming of the hard mask patterns, the spacers may be removed during etching of the hard mask layer.

The etch target layer may include a conductive material, and the etching the etch target layer forms word lines.

The etch target layer may include an insulating material, and trenches may be formed in the insulating material during etching the etch target layer.

According to another example embodiment, there is provided a method of forming fine patterns for a semiconductor device, the method including forming a hard mask layer over an etch target layer; forming carbon containing layer patterns over the hard mask layer; forming spacers that over opposing side walls of each of the carbon containing layer patterns; removing the carbon containing layer patterns; forming hard mask patterns by etching the hard mask layer by using the spacers as a first etching mask; and etching the etch target layer by using the hard mask patterns as a second etching mask.

The hard mask layer may include an oxide layer, and the spacers comprise a silicon nitride material.

According to a still further example embodiment, there is provided a method of forming fine patterns for a semiconductor device, the method including providing a substrate sequentially including an etch target layer, a hard mask layer, and carbon containing layer patterns; forming spacers over opposing side walls of each of the carbon containing layer patterns; removing the carbon containing layer patterns; forming hard mask patterns by etching the hard mask layer using the spacers as a first etching mask; and etching the etch target layer by using the hard mask patterns as a second etching mask.

The carbon containing layer patterns may be formed on the hard mask layer by spin coating an organic compound onto the hard mask layer to form an organic compound layer; baking the organic compound layer to form a carbon containing layer; and patterning the carbon containing layer.

The method may include baking the carbon containing layer for about 2 to about 4 hours at a temperature of about 700° C. or lower, prior to patterning the carbon containing layer. The organic compound layer may be baked for about 90 to about 180 seconds at a temperature of about 400° C. or lower.

The hard mask patterns may be formed of a material having an etching selectivity with respect that of the spacers.

The spacers may be formed of a silicon nitride material, and the hard mask patterns are formed of an oxide material.

BRIEF DESCRIPTION OF THE DRAWINGS

Example embodiments will be more clearly understood from the following detailed description taken in conjunction with the accompanying drawings in which.

DETAILED DESCRIPTION OF THE EXAMPLE EMBODIMENTS

Figure 1A:
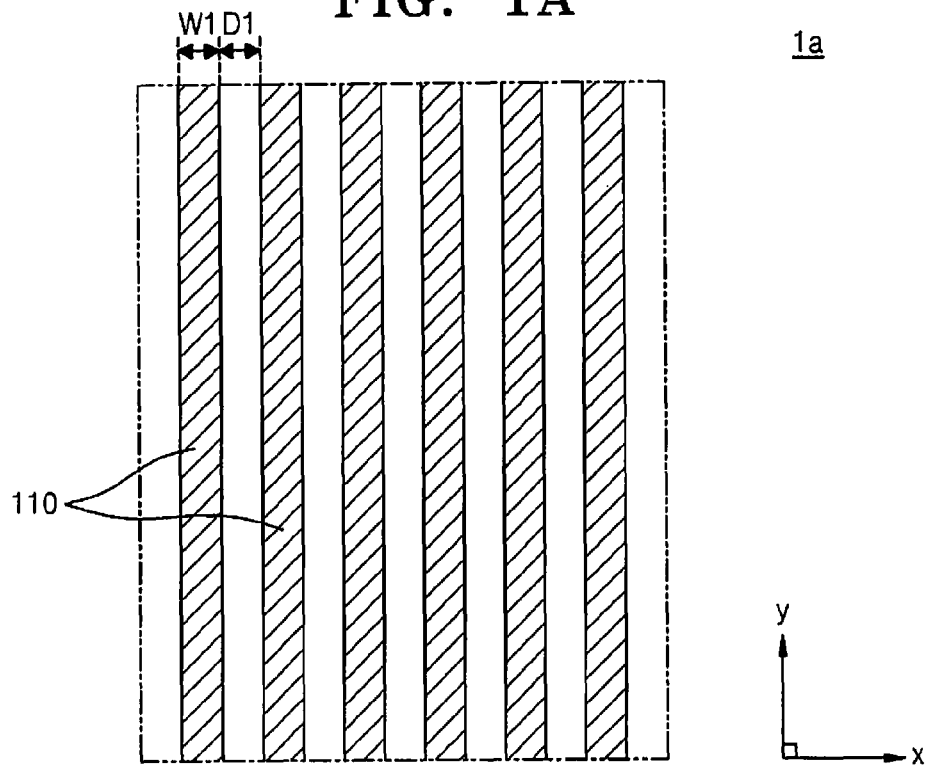
FIGS. 1A and 1B are layouts of an example semiconductor device realized by a method of forming fine patterns according to an example embodiment.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to methods of forming fine patterns of a semiconductor device, and/or more particularly, to methods of forming fine patterns by a double-patterning process.

In the drawings, denoted shapes may be modified according to fabrication technology and/or tolerance, for example. Therefore, example embodiments should not be limited to certain shapes shown in the drawings, but may include modifications that may be caused during fabrication processes, for example.

Figure 1B:
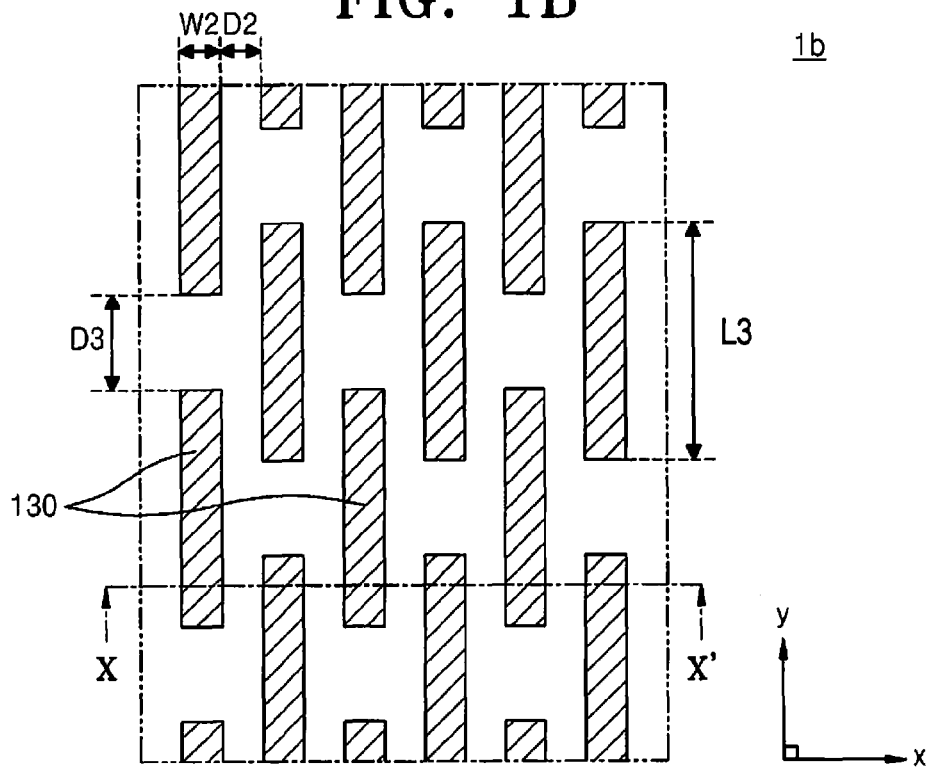

FIGS. 1A and 1B are layouts of fine patterns of example semiconductor devices realized by a method of forming fine patterns according to an example embodiment.

The fine patterns shown in FIGS. 1A and 1B may correspond to cell array areas in which unit memory devices are formed, if the semiconductor devices are memory devices.

Referring to FIG. 1A, a semiconductor device 1a includes a plurality of patterns 110 each having a first width W1, which are arranged in a direction (x-axis direction of FIG. 1A) at a first distance D1 therebetween. The first width W1 and the first distance D1 configure a pitch. The plurality of patterns 110 may be extended in a y-axis direction of FIG. 1A.

The plurality of patterns 110 may form an active area or conductive lines (or, patterns) on a cell array region of the semiconductor device 1a. The conductive lines (or, patterns) may be word lines or bit lines, for example. The first width W1 and the first distance D1 may vary depending on the type of the semiconductor device 1a used and desired characteristics of the semiconductor device 1a. For example, the first width W1 and the first distance D1 may be equal to each other. Otherwise, the first width W1 may be greater, or less, than the first distance D1.

Referring to FIG. 1B, a semiconductor device 1b includes a plurality of patterns 130, each having a second width W2 and a length L3 arranged in a respective directions (x-axis and y-axis directions, respectively, of FIG. 1B), and having a second distance D2 therebetween. The patterns 130 may be separated from each other by a third distance D3 in a y-axis direction of FIG. 1B. That is, the patterns 130 may be formed as islands.

The patterns 130 may form an active area of a cell array region or a conductive layer in the semiconductor device 1b. The second width W2, the second distance D2, and the third distance D3 may vary depending on the type of the semiconductor device 1b used and desired characteristics of the semiconductor device 1b.

FIGS. 2 through 11 are cross-sectional views and perspective views illustrating processes of forming fine patterns according to another example embodiment. FIGS. 2 through 8, and 11 show the semiconductor device of FIG. 1B taken alone line X-X'.

Figure 2:
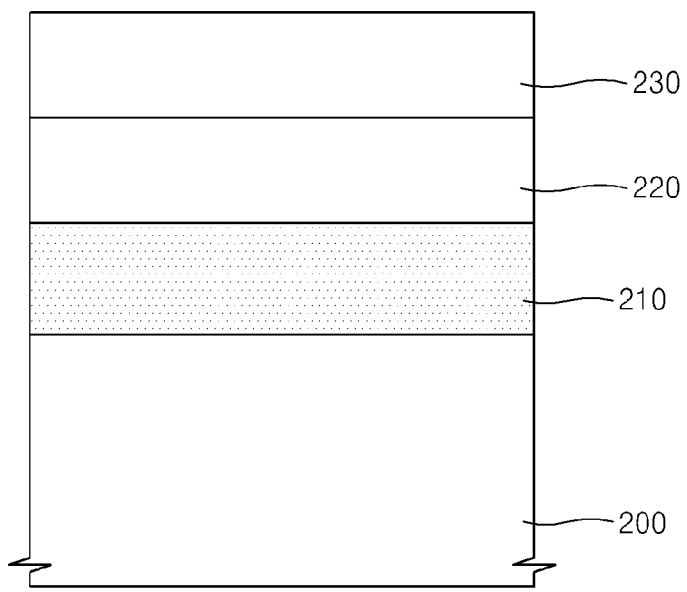
FIGS. 2 through 11 are cross-sectional views and perspective views illustrating processes of forming fine patterns for a semiconductor device according to another example embodiment.

Referring to FIG. 2, an etch target layer 210, a hard mask layer 220, and a carbon containing layer 230 are sequentially formed on a substrate 200.

The substrate 200 may include a semiconductor material, for example, IV-group semiconductor, III-V group compound semiconductor, or II-VI group compound semiconductor. For example, the IV-group semiconductor may include silicon, germanium, or silicon-germanium. In addition, the substrate 200 may be provided as a bulk wafer or an epitaxial layer. Otherwise, the substrate 200 may be a silicon-on-insulator (SOI) substrate or a gallium-arsenic substrate.

The etch target layer 210 may be formed of various materials selected depending on the use of a pattern that will be formed. When a gate electrode is formed on the substrate 200, the etch target layer 210 may be a conductive layer (e.g., a doped polysilicon layer, or a stacked structure including doped polysilicon and metal silicide layer). In addition, when bit lines are formed, the etch target layer 210 may be formed of a conductive metal nitride or metal (e.g., tungsten or aluminum). If it is desired to form fine patterns by etching the substrate 200, the etch target layer 210 may be omitted. For example, if the method according to the present example embodiment is used to define the active area on the substrate 200, the etch target layer 210 may be omitted.

The hard mask layer 220 is used as a mask for forming patterns on the etch target layer 210. The hard mask layer 220 may be at least one oxide layer selected from the group consisting of a thermal oxide layer, a chemical vapor deposition (CVD) oxide layer, an undoped silicate glass (USG) film, and a high density plasma (HDP) oxide film. In addition, the hard mask layer 220 may be formed by a CVD method, for example. Also, the hard mask layer 220 may be formed of a material that may provide an etch selectivity, or may be omitted depending on the material used to form the etch target layer 210. In addition, the hard mask layer 220 may be formed of polysilicon having an etch selectivity with respect to a spacer mask layer 260, or a SiON-based material including a small amount of silicon (Si).

The carbon containing layer 230 may be formed of an organic compound including an aromatic hydrocarbon compound including or derivatives thereof. For example, the carbon containing layer 230 may be formed of an aromatic organic compound such as phenyl, benzene, or naphthalene. The carbon containing layer 230 may have a relatively large carbon containing amount (e.g., about 85 to about 99 weight % (wt %)) with respect to a total weight. In addition, the carbon containing layer 230 may be formed by a spin coating method.

As an example for forming the carbon containing layer 230, the organic compound may be spin coated on the hard mask layer 220 to a thickness of about 1000 Å to about 5000 Å, and then, the organic compound layer is firstly baked at a temperature of about 400° C. or lower to form the carbon containing layer 230. The baking may be performed for about 90 to about 180 seconds. After that, the carbon containing layer 230 is secondarily baked at a temperature of about 700° C. or lower to harden the carbon containing layer 230. The second baking process may be performed for about 2 to about 4 hours.

As described above, the carbon containing layer 230 is formed through the first and second baking processes at the high temperature, and thus, the carbon containing layer 230 may be completely densified. Therefore, when another film (e.g., a spacer mask layer 260 as shown in FIG. 5) is formed on the carbon containing layer 230, shrinkage of a carbon containing layer pattern 230a (refer to FIG. 4) may be minimized (or, alternatively, prevented) even if the deposition process is performed at a high temperature of about 700° or lower.

That is, the spacer mask layer 260 (shown in FIG. 5) including silicon nitride may be formed on the carbon containing layer pattern 230a (refer to FIG. 4), and the hard mask layer 220 including an oxide layer may be etched by using a spacer (element 260a shown in FIG. 6) as an etching mask. Therefore, there is no need to form the polysilicon layer on the hard mask layer 220. Accordingly, an annealing process, a planarization process, and a cleaning process of the polysilicon layer may be omitted. Thus, the number of mask layers (polysilicon layers) may be reduced, and the processes may be simplified. In addition, defects caused by crystallization of the polysilicon layer may be prevented, and thus, fine patterns may be formed accurately.

Figure 3:
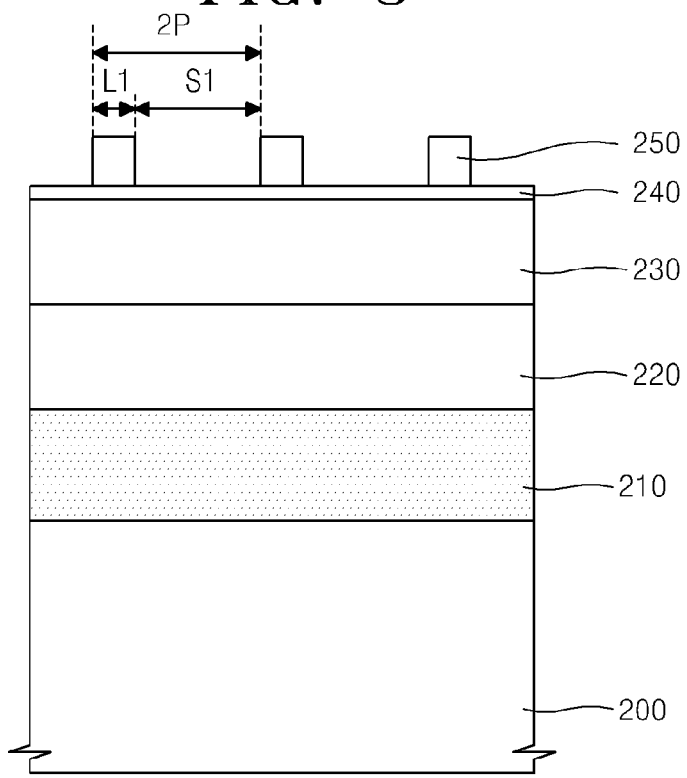

Referring to FIG. 3, an anti-reflection layer 240 is formed on the carbon containing layer 230.

In addition, a plurality of photoresist patterns 250 are formed on the anti-reflection layer 240 with desired (or, alternatively, predetermined) pitches (2P).

The anti-reflection layer 240 is formed to prevent reflection when the photoresist patterns 250 are formed.

The anti-reflection layer 240 may be formed by the CVD method or the spin coating method, and may include an organic or inorganic material. For example, the anti-reflection layer 240 may be an SiON layer formed by the CVD method, or a layer including Si or C formed by the spin coating method.

The photoresist patterns 250 are formed by forming a photoresist layer and performing a photolithography process.

The photolithography process may use an immersion lithography technology or an extreme ultraviolet (EUV) lithography technology. The immersion lithography technology is a technology that improves a resolution by filling a fluid of high refractive index between a lens and an exposure target so as to increase numeral aperture (NA).

A width L1 of the photoresist pattern 250 may correspond to the second distance D2 between the patterns 130 shown in FIG. 1B. In addition, the width L1 may correspond to a minimum feature size of the semiconductor device that is to be formed. The width L1 may be, for example, about several to tens of nm. A separating distance Si between two adjacent photoresist patterns 250 may be greater than the width L1 of the photoresist pattern 250. For example, the separating distance S1 may be about 2.5 to 3.5 times the width L1 of the photoresist pattern 250. The sum of the width L1 and the separating distance Si may be twice the pitch P of the fine patterns that will be formed.

Figure 4:
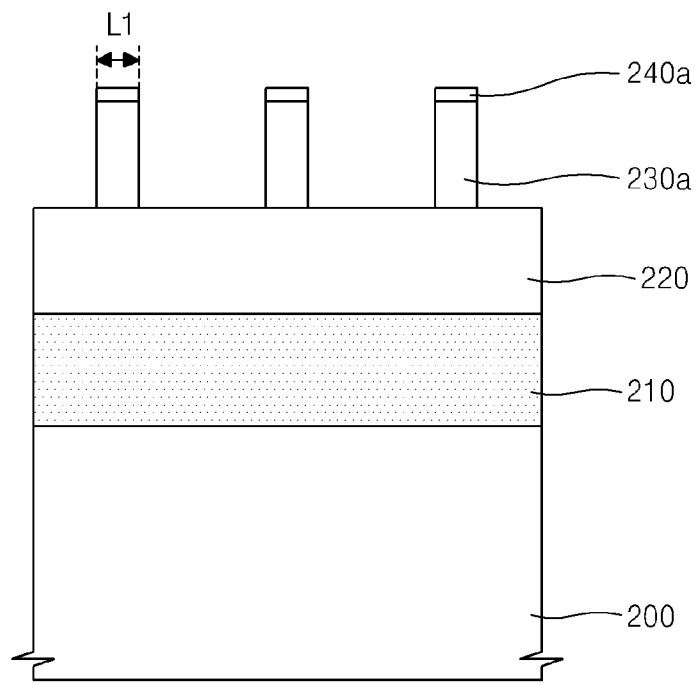
Figure 5:
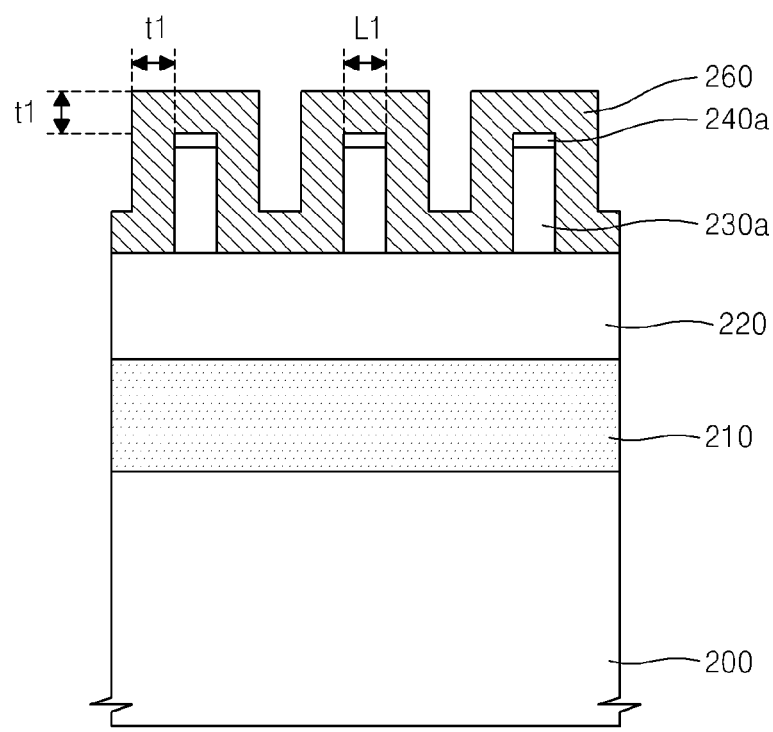

Referring to FIGS. 3 and 4, the anti-reflection layer 240 and the carbon containing layer 230 are sequentially etched by using the photoresist patterns 250 as the etching mask to form a plurality of anti-reflection patterns 240a and a plurality of carbon containing layer patterns 230a. After that, the photoresist patterns 250 and unnecessary materials generated during the etching processes are removed. In FIG. 4, the anti-reflection patterns 240a remain on the carbon containing layer patterns 230a. However, in another example embodiment, the anti-reflection patterns 240a may be removed.

The etching process may be, for example, a dry-etching process or a reactive ion etch (RIE) process. For example, a plasma etching process using a mixture gas including oxygen ($O_2$) and argon (Ar) may be used to etch the carbon containing layer 230.

Referring to FIG. 5, the spacer mask layer 260 that covers exposed surfaces of the anti-reflection patterns 240a and side walls of the carbon containing layer patterns 230a, and an exposed surface of the hard mask layer 220 is formed.

A thickness t1 of the spacer mask layer 260 may be determined according to a second width W2 of the patterns 130 (refer to FIG. 1B) that are desired to be formed. In some cases, the thickness t1 of the spacer mask layer 260 may be equal to the width L1 of the carbon containing layer patterns 230a. Otherwise, the thickness t1 of the spacer mask layer 260 may be less, or greater, than the width L1.

The spacer mask layer 260 may be formed of a material having an etch selectivity that is different from that of the hard mask layer 220. The spacer mask layer 260 may be formed of a silicon nitride material. To form the spacer mask layer 260 of the silicon nitride material, a silicon source gas (e.g., mono silane, dichlorosilane (DCS), hexachlorodisilane (HCS), trichlorosilane (TCS), or bis(tertiary-butylamino)silane (BT-BAS)) may be used. The above gases may be used as solo (or, homogeneous) gas, or a mixture of two or more gases (or, heterogeneous gas) may be used. In addition, $NH_3$ may be used as a nitrogen source gas. That is, the spacer mask layer 260 may be used by repeatedly performing a cycle of silicon source gas induction, purging, nitrogen source gas induction, and purging. As described above, because the spacer mask layer 260 is formed by an atomic layer deposition method, stress applied to the carbon containing layer patterns 230a when the spacer mask layer 260 is formed may be reduced. Accordingly, inclining (or, leaning) of the carbon containing patterns 230a due to the stress may be reduced.

In addition, the spacer mask layer 260 may be formed by a thermal atomic deposition method or a plasma atomic deposition method.

On the other hand, the deposition of the spacer mask layer 260 may be performed at a temperature of about 700° C. or lower.

Figure 6:
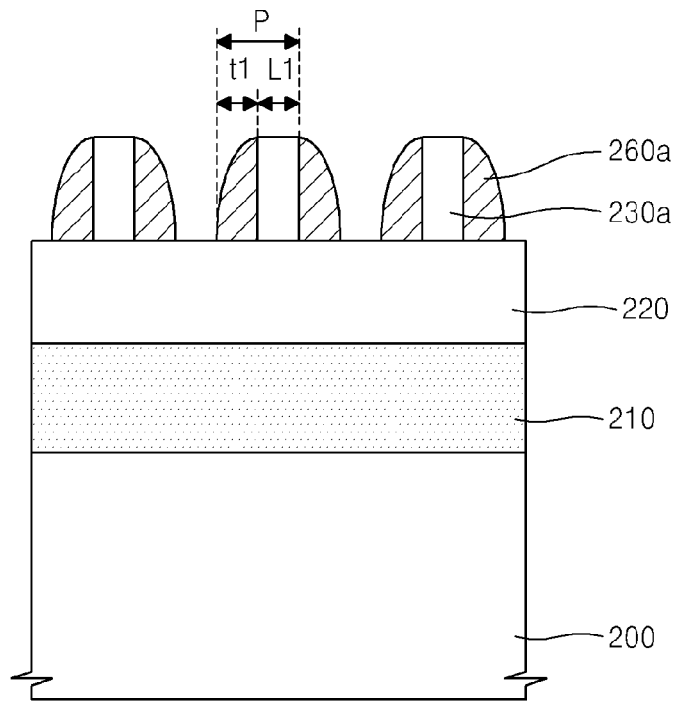

Referring to FIGS. 5 and 6, some parts of the spacer mask layer 260 shown in FIG. 5 are removed until upper surfaces of the carbon containing layer patterns 230a and an upper surface of the hard mask layer 220 are exposed. Thus, spacers 260a that cover side walls of the carbon containing layer patterns 230a are formed.

The spacers 260a may be used as the etching mask for increasing density of the patterns in post-processes. The sum of the width L1 of the carbon containing layer pattern 230a and the thickness t1 of the spacer 260a located on a side wall of the carbon containing layer pattern 230a may correspond to the pitch P of the semiconductor device that is to be formed.

While removing a part of the spacer mask layer 260, the anti-reflection patterns 240a may be also etched and removed. In another example embodiment, the anti-reflection patterns 240a may remain on the carbon containing layer patterns 230a.

In order to remove the parts of the spacer mask layer 260, a main etching gas (e.g., $C_xF_y$ gas (here, x and y are integers between 1 and 10), or $CH_xF_y$ gas (here, x and y are integers between 1 and 10)) may be used. Otherwise, at least one of $O_2$ and Ar may be mixed in the main etching gas. The $C_xF_y$ gas may be, for example, $C_3F_6$, $C_4F_6$, $C_4F_8$, or $C_5F_8$. The $CH_xF_y$ gas may be $CHF_3$ or $CH_2F_2$. Here, the oxygen ($O_2$) gas mixed in the etching gas removes polymer byproducts generated during the etching process, and dissolves the $C_xF_y$ etching gas. In addition, the Ar gas mixed in the etching gas is used as a carrier gas, and prompts ion bombarding. When some parts of the spacer mask layer 260 are removed, plasma of the etching gas (selected from the above described etching gases) is generated in an etching chamber so that the etching may be performed in the plasma atmosphere. Otherwise, in some cases, the plasma may not be generated in the etching chamber so that the etching may be performed in the selected etching gas atmosphere with no ion energy. For example, a mixture gas of $C_4F_6$, $CHF_3$, $O_2$, and Ar may be used as the etching gas. In this case, the plasma dry-etching process may be performed for a few seconds to tens of seconds while supplying each of the gases so that a volume ratio of the $C_4F_6$:$CHF_3$:$O_2$:Ar is about 1:6:2:14.

Figure 7:
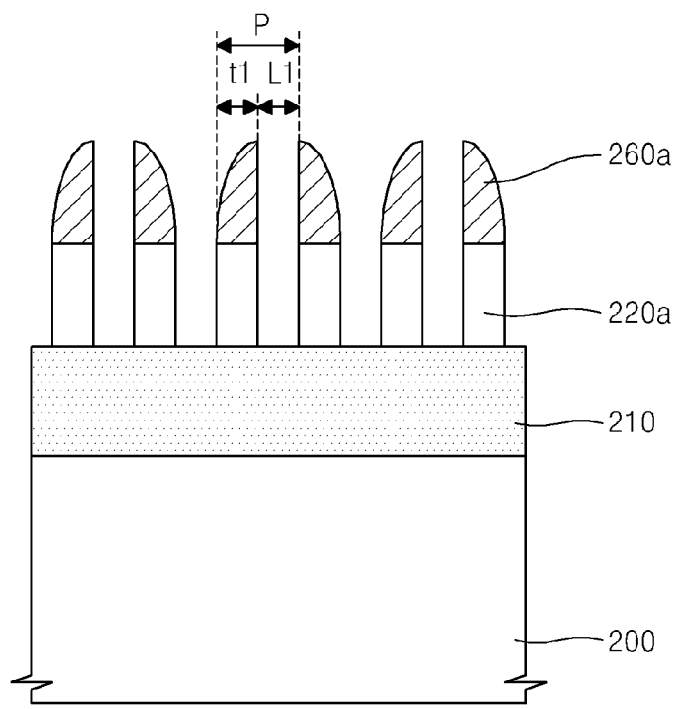

Referring to FIGS. 6 and 7, the carbon containing layer patterns 230a are removed. The carbon containing layer patterns 230a may be removed by a wet-etching method. Because the carbon containing layer patterns 230a are removed, the hard mask layer 220 is exposed between the two adjacent spacers 260a. In addition, the hard mask layer 220 is etching by using the spacers 260a as the etching mask so that the hard mask layer 220 is removed except for portions under the spacers 260a and hard mask patterns 220a are formed.

The removing process of the hard mask layer 220 may be performed under a condition where the etching of the spacers 260a is restrained.

In order to remove the hard mask layer 220, an anisotropic etching process using the dry etching or the wet etching method may be performed. For example, in the dry etching method, a mixture gas of $O_2$ and Ar may be used as the etching gas. As an example, the dry etching process of plasma type may be performed for a few seconds to tens of seconds under a pressure of about 1 to about 30 mTorr and a temperature of about −10° C. to about 40° C. while supplying the $O_2$ and Ar gases so that a volume ratio of $O_2$:Ar is about 1:4 to about 1:8.

Figure 8:
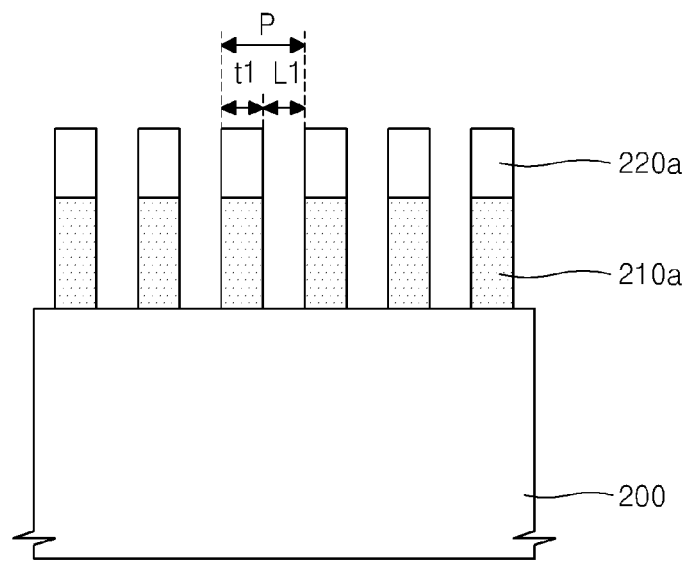

Referring to FIG. 8, the etch target layer 210 (refer to FIG. 7) is etched by using the spacers 260a (refer to FIG. 7) and the hard mask patterns 220a as the etching mask to form a plurality of fine patterns 210a. During etching the etch target layer 210 (refer to FIG. 4), the spacers 260a (refer to FIG. 4) may be etched and removed. A part of the exposed surfaces of the hard mask patterns 220a may be worn away (or, alternatively, removed) during etching the etch target layer 210.

Figure 9:
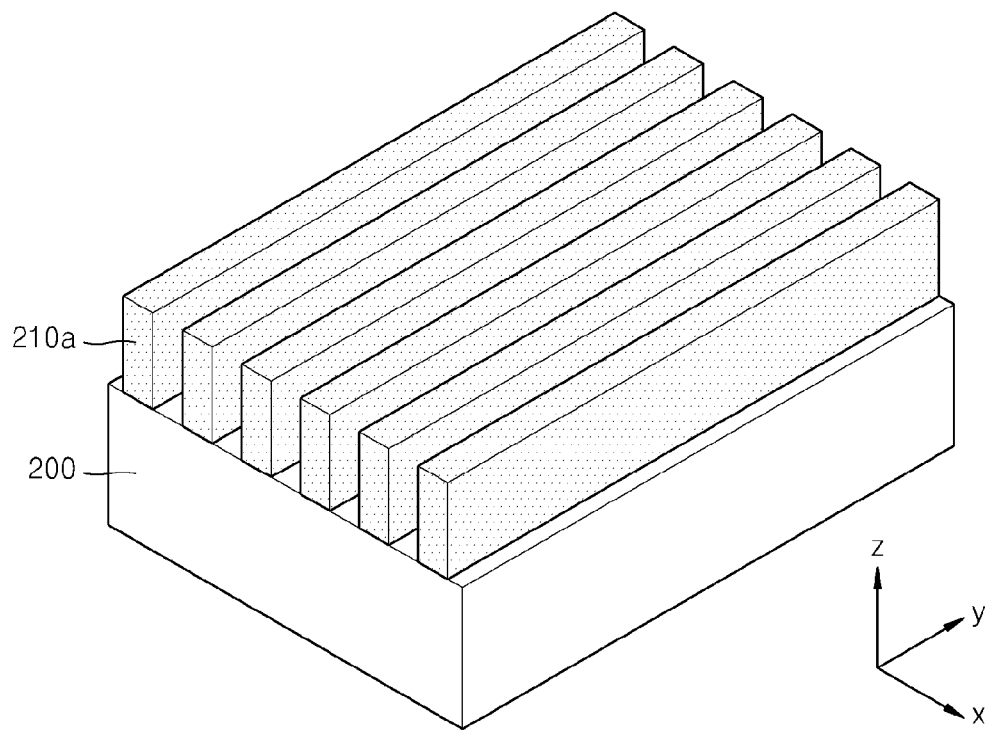

Referring to FIG. 9, the hard mask patterns 220a (refer to FIG. 8) are removed to form the semiconductor device including a plurality of fine patterns 210a on the substrate 200.

Referring to FIGS. 7 through 10A, a trimming process for forming (or, alternatively, cutting) the hard mask patterns 220a and the fine patterns 210a from certain regions is performed. The trimming process is performed to form island patterns 210b and 220b by cutting some parts of the spacers 260a and the hard mask patterns 220a that are formed as lines.

The trimming process may be performed by forming an additional mask layer 270 on the hard mask patterns 220a, and performing patterning and etching processes by using the photolithography method. The mask layer 270 may be formed of, for example, SOH.

As shown in FIG. 1B, to form the patterns 130 that are separated a third distance D3 from each other, cutting portions 270c that have the same third distance D3 therebetween may be formed. Through the patterning of the mask layer that opens the cutting portions 270C, the hard mask patterns 220a and the fine patterns 210a formed on the portions corresponding to the cutting portions 270c may be removed.

In order to remove the hard mask patterns 220a and the fine patterns 210, the dry-etching process or the wet-etching process may be performed. The etching process of the hard mask patterns 220a and the fine patterns 210a may be simultaneously performed as a single process. Otherwise, the etching process of the hard mask patterns 220a and the etching process of the fine patterns 210a may be sequentially formed.

In addition, the carbon containing layer patterns 230a are formed by using the photoresist patterns 250 in FIGS. 3 and 4; however, the carbon containing layer patterns 230a may be formed by the method of forming the fine patterns described with reference to FIGS. 3 through 8, and then, the fine patterns having a desired (or, alternatively, predetermined) pitch (P/2) may be formed by repeatedly performing the processes illustrated in FIGS. 5 through 8. That is, a quadruple patterning process is performed, and thus, finer patterns than the patterns formed by a double patterning process may be formed. The quadruple patterning process forms the fine patterns by repeating the double patterning process.

Figure 10A:
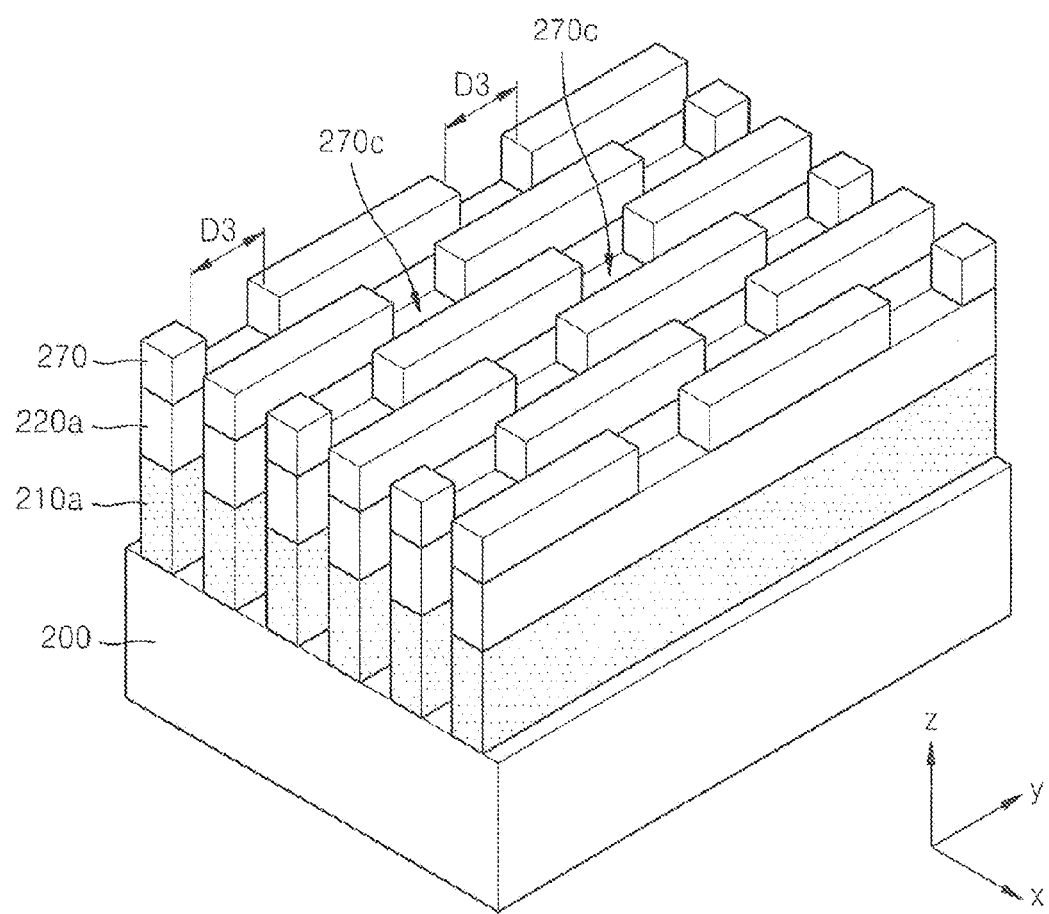
Figure 10B:
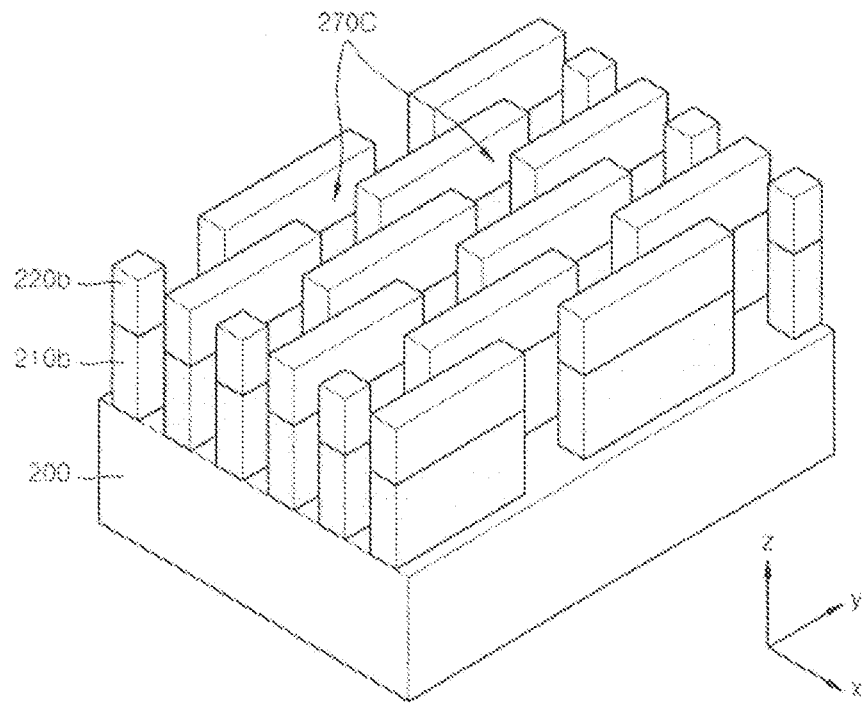
Figure 11:
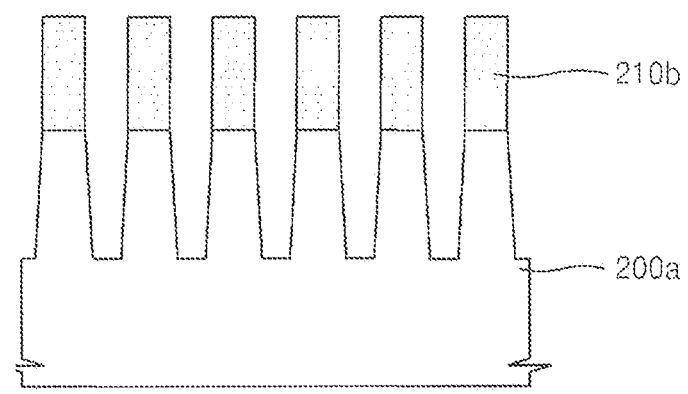

Referring to FIGS. 10B and 11, second island patterns 220b and hard mask island patterns 210b are used as an etching mask to remove some parts of the substrate 200 and to form substrate patterns 200a. During the etching process, the second island patterns 220b may be also etched and removed. The substrate patterns 200a may be formed by an anisotropic etching process, for example, the plasma etching process.

Next, the hard mask island patterns 210b are removed to form final substrate patterns 200a.

According to the method of forming the fine patterns described with reference to FIGS. 2 through 11, the density of patterns may be increased by performing the double patterning process that uses the spacers 260a formed on the side walls of the carbon containing layer patterns 230a as the etching mask, and thus, the substrate patterns 200a of narrow widths may be formed. During the above process, when the spacers 260a on the carbon containing layer patterns 230a are formed, the nitride layer may be used instead of using an oxide layer. Therefore, an additional mask layer (for example, a polysilicon layer) is not necessary, and thus, processes may be simplified. In addition, because the annealing, planarizing, and cleaning processes of the additional mask layer are not performed, costs may be reduced and the fine patterns may be accurately formed.

In addition, after the trimming process, the etching process for patterning the substrate 200 is only performed. Thus, pattern erosion (e.g., corner rounding) of the island patterns may be prevented. In addition, because the trimming is performed right before the patterning of the substrate 200, generation of loading effect caused by the island patterns may be reduced. The loading effect generally refers to uneven etching speed at the etched layer due to unevenness of the etching material that reacts with the etched layer. According to the present example embodiment, inclinations formed on the patterns caused by the loading effect may be reduced (or, alternatively, prevented), and the patterns having uniform line widths may be formed.

Figure 12:
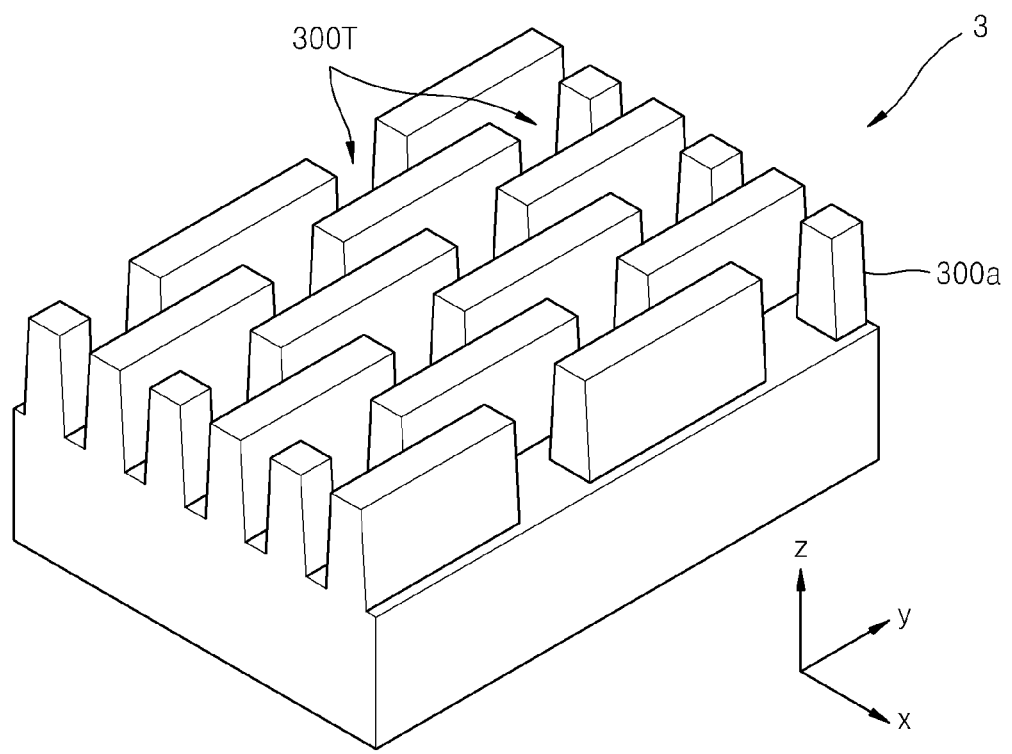
FIG. 12 is a perspective view of a semiconductor device adopting a method of forming fine patterns according to an example embodiment.

FIG. 12 is a perspective view of a semiconductor device in which fine patterns are formed by a method of forming fine patterns according to an example embodiment.

Referring to FIG. 12, active area patterns 300a of a semiconductor device 3 are formed. The active area patterns 300a may be formed by the method of forming the fine patterns described with reference to FIGS. 2 through 11. The active area patterns 300a include a plurality of island patterns. Trenches 300T are formed between the active area patterns 300a, an insulating material are deposited in the trenches 300T in post-processes to form a device isolating layer.

According to the method of forming the fine patterns of the present example embodiment, the etching process for forming the active area is performed after the trimming process. Thus, the corner rounding and the loading effect may be prevented and the active area having the even line width may be formed. If the semiconductor device is, for example, a dynamic random access memory (DRAM) device, bit line contacts may be formed on the active area patterns 300a. In this case, the reduction of the line width of the active area or the corner rounding may be prevented, an area where the bit line contacts contact the active area may not be reduced. Therefore, increase in resistance of the bit line contacts caused by a reduction in the contact area may be prevented.

According to the method of forming the fine patterns, the active area patterns 300a may be repeatedly formed with a fine pitch of about ½ of the pitch that may be realized in the general photolithography process. Therefore, the plurality of active areas that are repeatedly formed with the fine pitch exceeding the resolution limitations in a photolithography process may be easily realized.

In addition, the fine patterning may be performed through one photolithography process, and thus, defects and variation in pattern widths caused by the mis-alignment due to the two exposure processes may be prevented.

Figure 13:
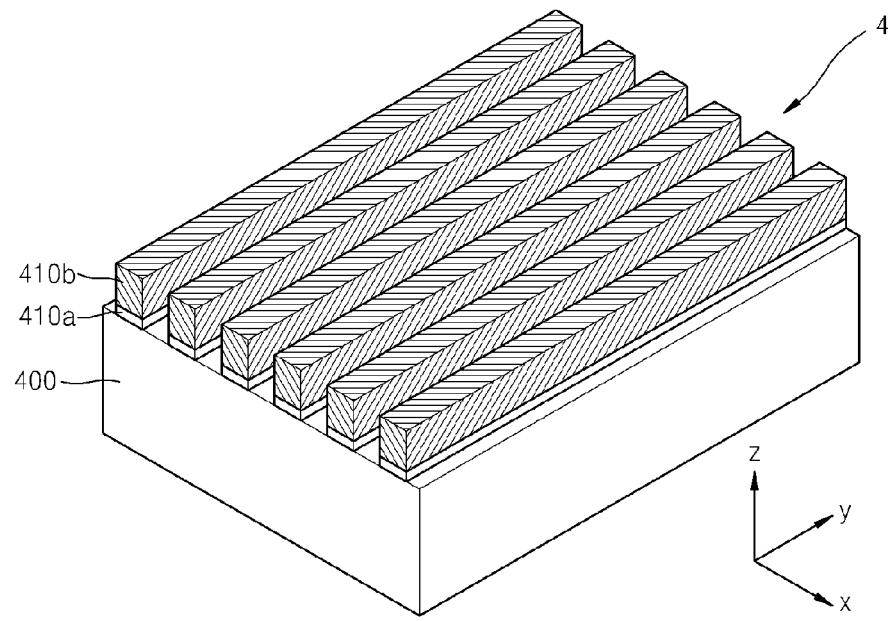
FIG. 13 is a perspective view of a semiconductor device adopting a method of forming fine patterns according to another example embodiment.

FIG. 13 is a perspective view of a semiconductor device adopting the method of forming fine patterns according to another example embodiment.

Referring to FIG. 13, a semiconductor device 4 includes gate insulating layer patterns 410a formed on a substrate 400, and word lines 410b to which a gate electrode is connected. The gate insulating layer patterns 410a and the word lines 410b are formed by the method of forming the fine patterns described with reference to FIGS. 2 through 11. That is, a stacked structure of the gate insulating layer patterns 410a and the word lines 410b becomes an etch target layer to form the patterns. The gate insulating layer patterns 410a and the word lines 410b may correspond to the plurality of fine patterns 210a shown in FIG. 10.

The substrate 400 may include a semiconductor material, for example, a III-V group compound semiconductor or a II-VI oxide semiconductor. For example, the IV group semiconductor may include silicon, germanium, or silicon-germanium. In addition, the substrate 400 may be provided as a bulk wafer or an epitaxial layer. Otherwise, the substrate 400 may be an SOI substrate, or a gallium-arsenic substrate.

The gate insulating layer 410 may include a silicon oxide material. The word line 410b may include a conductive material. For example, the word line 410b may include at least one conductive material selected from the group consisting of TaN, TiN, W, WN, HfN, tungsten silicide, and a combination thereof. In another example embodiment, the word lines 410b may further include a charge storage layer (not shown) formed on the gate insulating layer pattern 410a.

The semiconductor device 4 may be a memory device such as a DRAM device, a phase-change random access memory (PRAM) device, or a flash memory device.

According to the present example embodiment, the word lines 410b of the semiconductor device 4 may be formed as fine lines each having a width of tens of nm, for example, 30 nm or less. In addition, the number of mask layers may be reduced, and thus, processes may be simplified.

Figure 14:
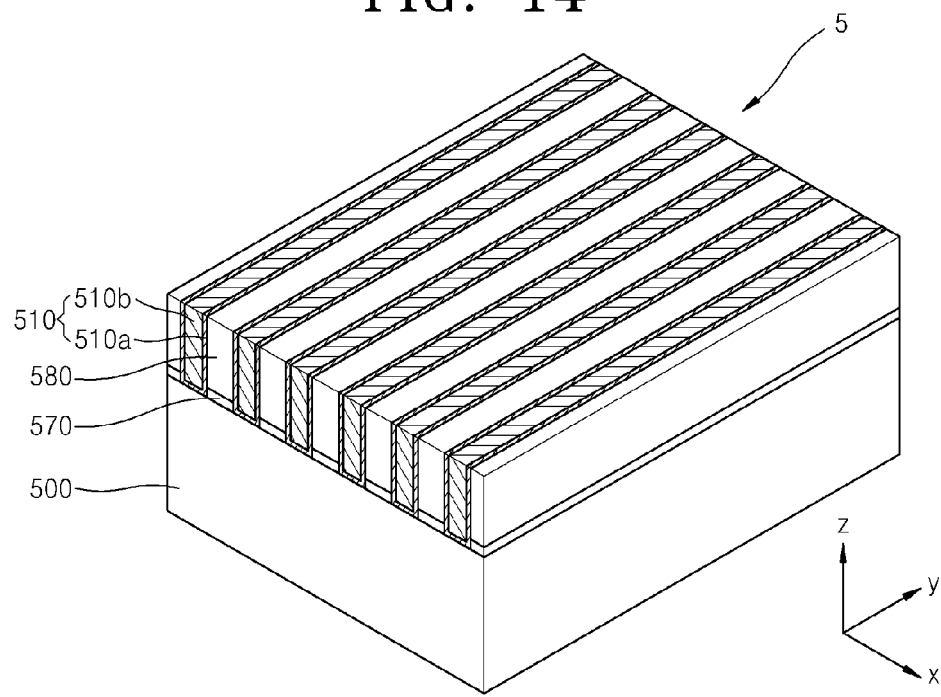
FIG. 14 is a perspective view of a semiconductor device adopting a method of forming fine patterns according to a further example embodiment.

FIG. 14 is a perspective view of a semiconductor device adopting the method of forming fine patterns according to a further example embodiment.

Referring to FIG. 14, a semiconductor device 5 includes a substrate 500 on which desired (or, alternatively, predetermined) unit devices (e.g., a plurality of word lines, and an interlayer dielectric covering the word lines), and bit lines 510 are formed.

The substrate 500 may include a semiconductor material, for example, a III-V group compound semiconductor or a II-VI oxide semiconductor. For example, the IV group semiconductor may include silicon, germanium, or silicon-germanium. In addition, the substrate 500 may be provided as a bulk wafer or an epitaxial layer. Otherwise, the substrate 500 may be an SOI substrate, or a gallium-arsenic substrate.

Each of the bit lines 510 may include an anti-dispersion layer 510a and a conductive layer 510b. An etch stop layer 570 and an insulating layer 580 on the etch stop layer 570 may be formed between the bit lines 510.

The bit lines 510 may be formed by the method of forming the fine patterns described with reference to FIGS. 2 through 11. That is, a stacked structure of the etch stop layer 570 and the insulating layer 580 is etched to be patterned, and after that, the anti-dispersion layers 510a and the conductive layers 510b may be stacked to form the bit lines 510.

The etch stop layer 570 may be a silicon nitride layer, and the insulating layer 580 may be an oxide layer.

The anti-dispersion layer 510a is formed to prevent metal atoms of the conductive layer 510 from dispersing to neighboring layers. The anti-dispersion layer 510a may be formed to a thickness of about a few to hundreds of angstroms (Å). The anti-dispersion layer 510a may be formed of Ta, TaN, TiN, TaSiN, TiSiN, or a combination thereof. The anti-dispersion layer 510a may be formed by the CVD process or the sputtering process. In another example embodiment, the anti-dispersion layer 510a may be omitted.

The conductive layer 510b may be formed of a metal selected from the group consisting of Cu, W, Al and a combination thereof. In order to form the conductive layer 510b, a physical vapor deposition (PVD) method or an electroplating method may be used.

After forming the anti-dispersion layer 510a and the conductive layer 510b, a part of the stacked structure is removed and planarized by a chemical mechanical polishing (CMP) process. As described above, the bit lines 510 may be formed by a damascene process. According to the present example embodiment, the bit lines 510 of fine patterns density of which is improved may be formed.

Figure 15:
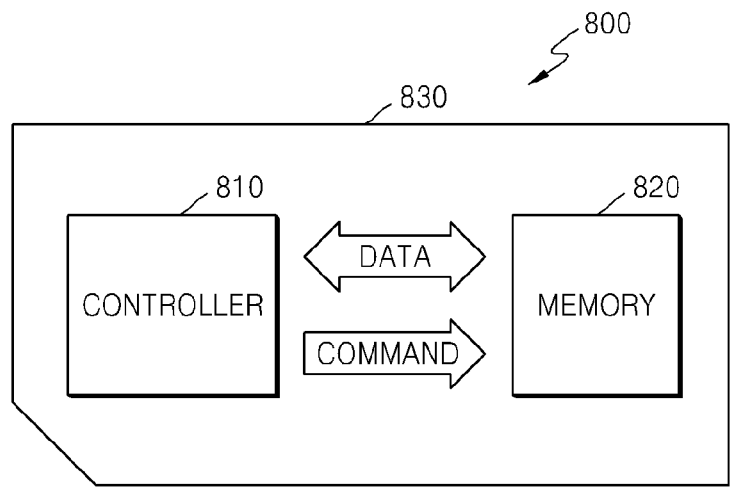
FIG. 15 is a block diagram of a memory card including a semiconductor device according to an example embodiment.

FIG. 15 is a block diagram of a memory card including a semiconductor device according to an example embodiment.

Referring to FIG. 15, a memory card 800 includes a controller 810 and a memory 820 that are built in a housing 830. The controller 810 and the memory 820 exchange electric signals with each other. For example, the memory 820 and the controller 810 may transmit/receive data to/from each other according to a command of the controller 810. Accordingly, the memory card 800 may store the data in the memory 820 or outputs data from the memory 820 to outside. A cell array area of the memory 820 may be formed by the method of forming fine patterns according to the example embodiment.

The memory card 800 may be used as a data storage medium in various portable appliances. For example, the memory card 800 may include a multimedia card (MMC) or a secure digital (SD) card.

Figure 16:
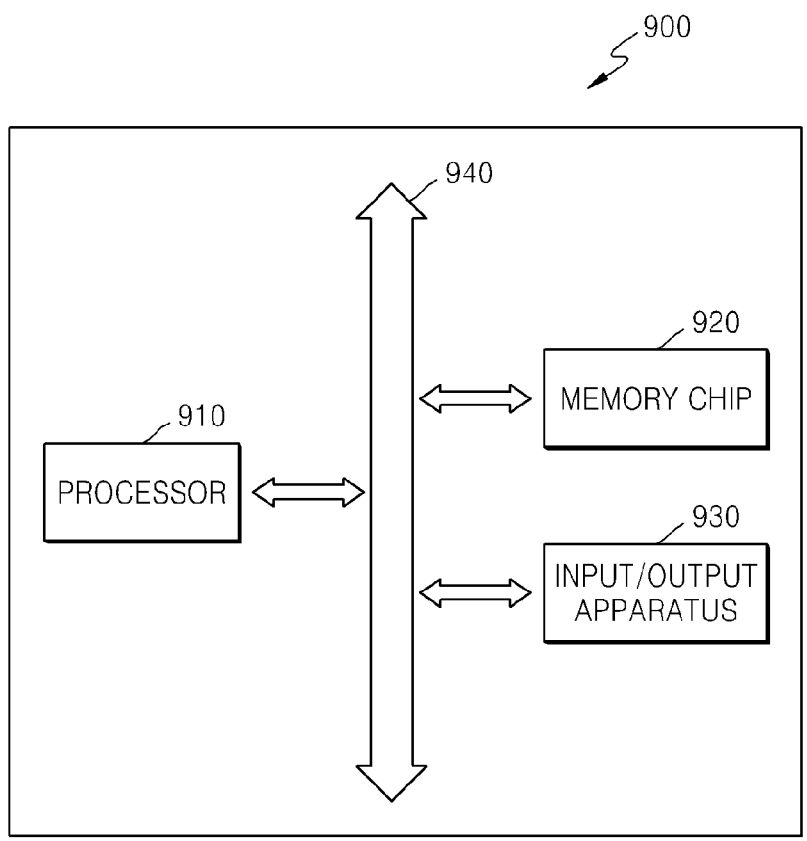
FIG. 16 is a block diagram of an electronic system including a semiconductor device according to an example embodiment.

FIG. 16 is a block diagram of an electronic system including a semiconductor device according to an example embodiment.

Referring to FIG. 16, the electronic system 900 includes a processor 910, an input/output apparatus 930, and a memory chip 920, which may perform data communications with each other via a bus 940. The processor 910 executes a program and controls the electronic system 900. The input/output apparatus 930 may be used to input or output data into/from the electronic system 900. The electronic system 900 is connected to an external device, for example, a personal computer, or a network via the input/output apparatus 930 to exchange data with the external device. The memory chip 920 may store codes and data for operating the processor 910. The memory chip 920 may include a memory device that is formed by the method of forming the fine patterns according to one of the above example embodiments.

The electronic system 900 may configure various electronic controlling apparatuses requiring the memory chip 920, for example, the electronic system 900 may be used in mobile phones, MP3 players, navigations, solid state disk (SSD), and household appliances.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of forming fine patterns for a semiconductor device, the method comprising:
    forming a hard mask layer over an etch target layer;
    forming a carbon containing layer over the hard mask layer, the forming a carbon containing layer including,
        forming an organic compound layer on the hard mask layer,
        performing a first baking process on the organic compound layer for about 90 seconds to about 180 seconds at a first temperature of about 400° C. or less, and
        performing a second baking process for about 2 hours to about 4 hours at a second temperature of about 700° C. or less,
        the first baking process being performed for a longer amount of time than the second baking process, and
        the second temperature being higher than the first temperature;
    forming carbon containing layer patterns by etching the carbon containing layer;
    forming spacers over opposing side walls of each of the carbon containing layer patterns;
    removing the carbon containing layer patterns;
    forming hard mask patterns by etching the hard mask layer using the spacers as a first etching mask; and
    etching the etch target layer by using the hard mask patterns as a second etching mask.

2. The method of claim 1, wherein the hard mask layer is at least one oxide layer selected from a thermal oxide layer, a chemical vapor deposition (CVD) oxide layer, an undoped silicate glass (USG) film, and a high density plasma (HDP) oxide film.

3. The method of claim 1, wherein the spacers are formed of a silicon nitride material.

4. The method of claim 1, wherein the forming spacers comprises:
    forming a spacer mask layer covering exposed surfaces of the carbon containing layer patterns and an exposed surface of the hard mask layer; and
    partially removing the spacer mask layer so that upper surfaces of the carbon containing layer patterns and an upper surface of the hard mask layer are exposed, and the spacers remain on both side walls of the carbon containing layer patterns.

5. The method of claim 4, wherein the forming a spacer mask layer includes using an atomic layer deposition method.

6. The method of claim 1, wherein the carbon containing layer patterns, the spacers, and the hard mask patterns are formed as lines.

7. The method of claim 6, further comprising:
    partially trimming the hard mask patterns so as to form island patterns, after forming the hard mask patterns.

8. The method of claim 7, wherein the partially trimming the hard mask patterns comprises:
    forming an etching mask layer on the hard mask patterns formed as lines;
    exposing at least a part of the hard mask patterns by removing portions of the etching mask layer; and
    etching the exposed part of the hard mask patterns.

9. The method of claim 1, further comprising:
    forming an anti-reflection layer on the carbon containing layer, after forming the carbon containing layer.

10. The method of claim 1, wherein, during the forming hard mask patterns, the spacers are removed during etching the hard mask layer.

11. The method of claim 1, wherein,
    the etch target layer comprises a conductive material, and
    the etching the etch target layer forms word lines.

12. The method of claim 1, wherein,
    the etch target layer comprises an insulating material, and
    trenches are formed in the insulating material during etching the etch target layer.

13. A method of forming fine patterns for a semiconductor device, the method comprising:
    providing a substrate sequentially including an etch target layer, a hard mask layer, and carbon containing layer patterns, the carbon containing layer patterns being formed over the hard mask layer by,
        baking an organic compound layer for a first time interval of about 90 seconds to about 180 seconds at a first temperature of about 400° C. or lower until a carbon containing layer is formed from the organic compound layer, and
        baking the carbon containing layer for a second time interval of about 2 hours to about 4 hours at a second temperature of about 700° C. or lower such that the carbon containing layer is hardened;
    forming spacers over opposing side walls of each of the carbon containing layer patterns;
    removing the carbon containing layer patterns;
    forming hard mask patterns by etching the hard mask layer using the spacers as a first etching mask; and
    etching the etch target layer by using the hard mask patterns as a second etching mask.

14. The method of claim 13, wherein the carbon containing layer patterns are formed on the hard mask layer by,
    spin coating an organic compound onto the hard mask layer to form the organic compound layer, prior to baking the organic compound layer;
    and
    patterning the carbon containing layer.

15. The method of claim 13, wherein the hard mask patterns are formed of a material having an etching selectivity with respect that of the spacers.

16. The method of claim 15, wherein,
    the spacers are formed of a silicon nitride material, and
    the hard mask patterns are formed of an oxide material.

* * * * *